(12) United States Patent
    Nagano

(10) Patent No.: US 10,036,091 B2
(45) Date of Patent: Jul. 31, 2018

(54) SEMICONDUCTOR MANUFACTURING APPARATUS AND MANUFACTURING METHOD OF SEMICONDUCTOR DEVICE

(71) Applicant: TOSHIBA MEMORY CORPORATION, Minato-ku, Tokyo (JP)

(72) Inventor: Hajime Nagano, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/654,936

(22) Filed: Jul. 20, 2017

(65) Prior Publication Data

US 2018/0105936 A1    Apr. 19, 2018

(30) Foreign Application Priority Data

Oct. 18, 2016 (JP) ................. 2016-203984

(51) Int. Cl.
  *H01L 21/67* (2006.01)
  *C23C 16/458* (2006.01)
  *C23C 16/44* (2006.01)
  *C23C 16/34* (2006.01)
  *H01L 21/02* (2006.01)

(52) U.S. Cl.
  CPC ........ *C23C 16/4584* (2013.01); *C23C 16/345* (2013.01); *C23C 16/4401* (2013.01); *H01L 21/0217* (2013.01); *H01L 21/02271* (2013.01)

(58) Field of Classification Search
  CPC ............ C23C 16/345; C23C 16/4401; C23C 16/4584; H01L 21/02271; H01L 2924/0002; H01L 21/0217; H01L 21/67253; H01L 21/02639; H01L 21/67781; H01L 21/67742; H01L 21/67196; H01L 21/67763
  See application file for complete search history.

(56) References Cited

U.S. PATENT DOCUMENTS 5,752,609 A   5/1998 Kato et al.
7,145,667 B2   12/2006 Yamamoto et al.
(Continued)

FOREIGN PATENT DOCUMENTS

JP       H05-291166 A   11/1993
JP       3323168 B2      9/2002

*Primary Examiner* — Jasmine Clark
(74) *Attorney, Agent, or Firm* — Foley & Lardner LLP

(57) ABSTRACT

According to some embodiments, a semiconductor manufacturing apparatus includes a first boat and a second boat, each of the first boat and the second boat having two support rings respectively provided at a top end and a bottom end thereof and a plurality of pillars provided between the top support ring and bottom support ring and spaced apart from one another. The pillar is provided with support protrusions on which a semiconductor substrate can be placed, and vertical positions of upper surfaces of the support protrusions of the second boat are lower than positions of upper surfaces of the support protrusions of the first boat. The semiconductor apparatus is configured to lift the second boat such that the positions of the upper surfaces of the support protrusions provided in the second boat are positioned above the positions of the upper surfaces of the support protrusions provided in the first boat.

8 Claims, 10 Drawing Sheets

(56) References Cited

U.S. PATENT DOCUMENTS

| | | | |
|---|---|---|---|
| 8,426,117 B2* | 4/2013 | Hasebe | C23C 16/02 |
| | | | 430/313 |
| 9,349,586 B2* | 5/2016 | Shimamoto | H01L 21/02126 |
| 9,540,743 B2* | 1/2017 | Takahashi | C30B 1/023 |

* cited by examiner

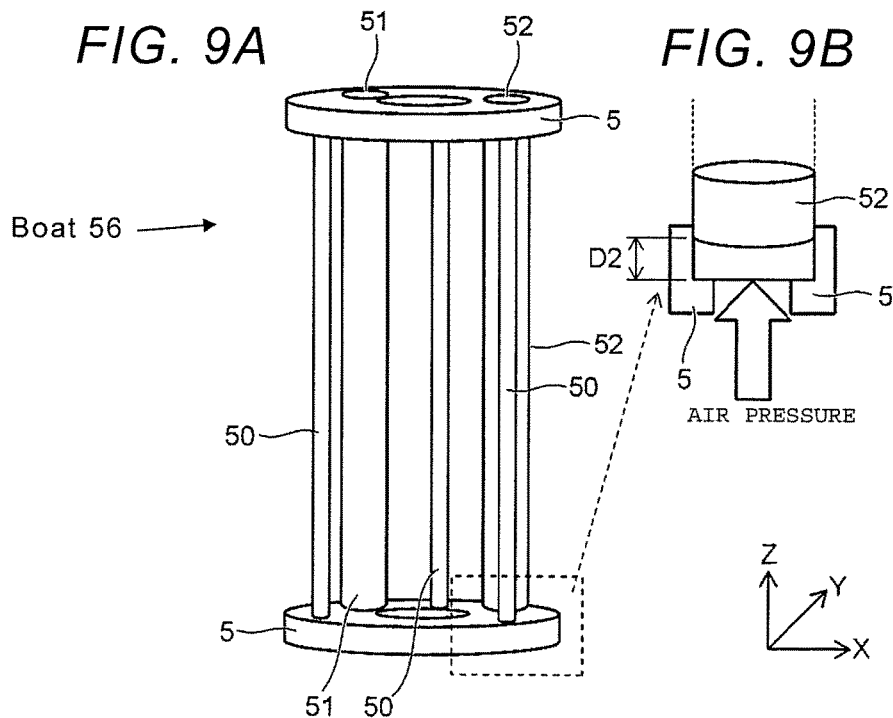
FIG. 9A
FIG. 9B
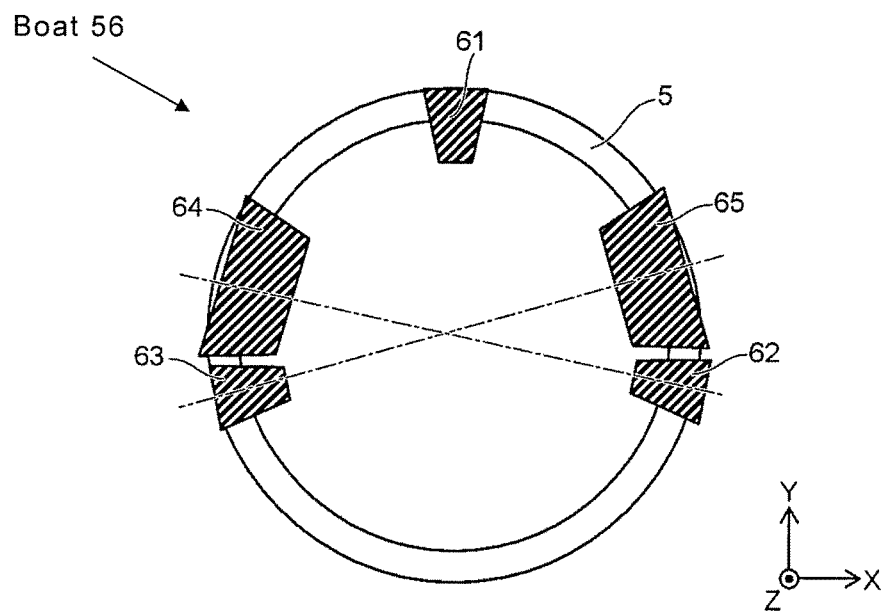
FIG. 10

SEMICONDUCTOR MANUFACTURING APPARATUS AND MANUFACTURING METHOD OF SEMICONDUCTOR DEVICE

CROSS-REFERENCE TO RELATED APPLICATION

This application claims the benefit of and priority to Japanese Patent Application No. 2016-203984, filed Oct. 18, 2016, the entire contents of which are incorporated herein by reference.

FIELD

Embodiments described herein relate generally to a semiconductor manufacturing apparatus that performs a film forming process on a semiconductor substrate and a manufacturing method of a semiconductor device.

BACKGROUND

Some film forming apparatuses that form a film on the surface of a semiconductor substrate may, in some implementations, fail to deposit or partially deposit film on some parts or portions of the semiconductor substrate, since a film forming gas does not come into contact with the semiconductor substrate in a contact region between the semiconductor substrate and a boat or wafer carrier serving as a jig for loading the semiconductor substrate on an upper surface of a support part. Therefore, a film may not be generated or may be only partially generated on a portion of the rear surface of the semiconductor substrate. This may be problematic in and of itself. Additionally, this may cause surrounding film to peel near or at the area, which can lead to generation of dust and/or become a focus of deviation due to exposure.

In order to cope with at least these problems, a semiconductor substrate can be taken out of the film forming apparatus at about a halfway-point of the time specified for the film deposition process, rotated and reinserted in the film forming apparatus, and the film deposition may resume for the remaining time. However, since the semiconductor substrate is taken out from the film forming apparatus, productivity may be reduced. Moreover, impurities may be caught in a film interface and thus semiconductor device characteristics may undesirably change.

BRIEF DESCRIPTION OF THE DRAWINGS

FIG. 9A and FIG. 9B are oblique views of embodiments of a boat part of a semiconductor manufacturing apparatus according to a second embodiment.

FIG. 10 is a top plan view of embodiments of the boat part of the semiconductor manufacturing apparatus according to the second embodiment.

DETAILED DESCRIPTION

Some example embodiments provide for a semiconductor manufacturing apparatus capable of suppressing film peeling due to a failure to deposit or partially deposit film on a part of a semiconductor substrate, such as on the rear surface of the semiconductor substrate in a contact region with a jig for loading the semiconductor substrate. Some example embodiments provide for a manufacturing method of a semiconductor device.

In general, according to one embodiment, a semiconductor manufacturing apparatus includes a semiconductor substrate processing chamber, a gas supply device that supplies semiconductor substrate processing gas to the semiconductor substrate processing chamber, a first boat, a second boat, and a pillar lifting device. The first boat is provided in the semiconductor substrate processing chamber and has support rings provided at a top end and a bottom end thereof, and a plurality of pillars provided between the top and bottom support rings and spaced apart from one another. The plurality of pillars are provided with support protrusions on which a semiconductor substrate can be placed. The second boat is provided in the semiconductor substrate processing chamber and has support rings provided at a top end and a bottom end thereof and a plurality of pillars provided between the top and bottom support rings and spaced apart from one another. The plurality of pillars are provided with support protrusions on which the semiconductor substrate can be placed, and the second boat is disposed outside and/or inside the first boat. The vertical positions of upper surfaces of the support protrusions of the second boat are lower than positions of upper surfaces of the support protrusions of the first boat. The pillar lifting device lifts the second boat until the positions of the upper surfaces of the support protrusions provided in the second boat are positioned above the positions of the upper surfaces of the support protrusions provided in the first boat.

In this disclosure, example embodiments will be described with reference to the drawings. The present disclosure is not limited to the described embodiments.

(First Aspect)

Figure 1:
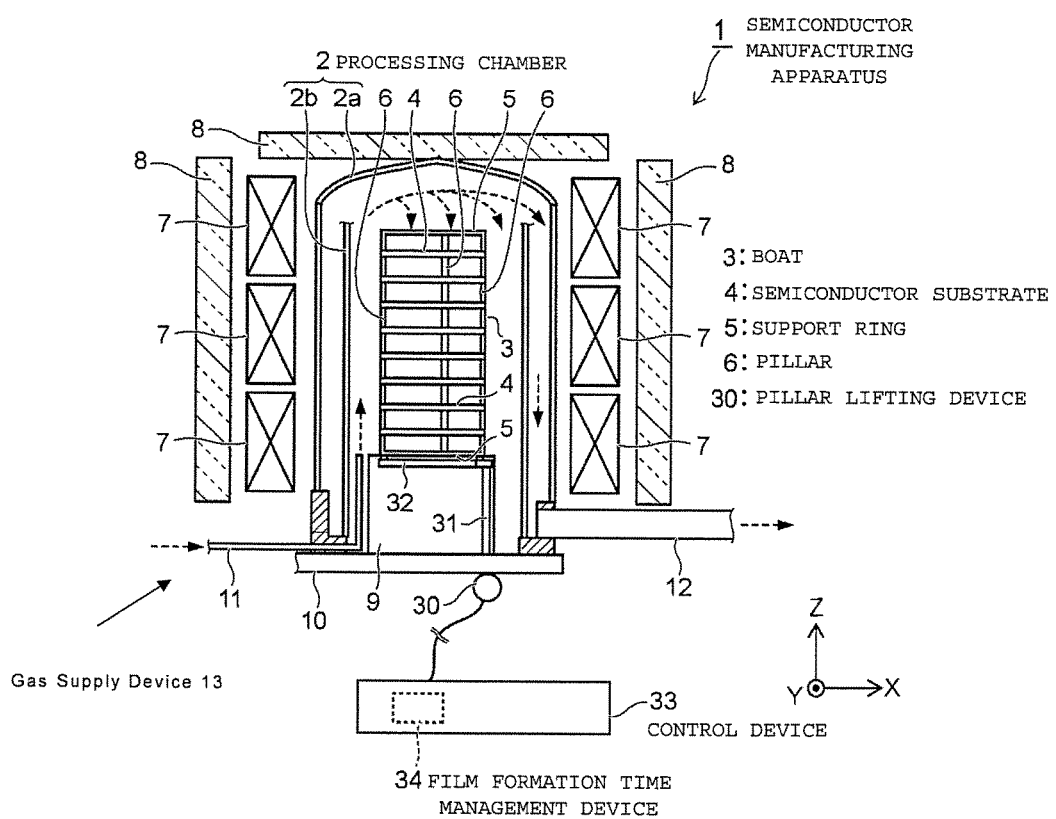
FIG. 1 is a longitudinal sectional view illustrating a schematic internal configuration of embodiments of a semiconductor manufacturing apparatus according to a first aspect.

FIG. 1 depicts some embodiments of a semiconductor manufacturing apparatus 1 according to the first aspect. The semiconductor manufacturing apparatus 1 is a CVD (chemical vapor deposition) film forming apparatus having a semiconductor substrate processing chamber 2. A boat 3 is provided in the semiconductor substrate processing chamber 2 and one or more semiconductor substrates 4 are placed on or in the boat 3. Although the semiconductor substrates 4 are often referenced herein in the descriptions of semiconductor manufacturing apparatuses, the semiconductor substrates are in some embodiments removable, and are not necessarily considered to be part of the semiconductor manufacturing apparatuses. The boat 3 has support rings 5 (which can function as, for example, pillar support parts) provided at least at a top end and a bottom end of the boat, and a plurality of pillars 6 provided between the top and bottom support rings 5 and spaced apart from one another.

The semiconductor substrate processing chamber 2 includes an outer tube 2a which can help to block an interior of the semiconductor substrate processing chamber 2 from an exterior environment, and an inner tube 2b provided in the outer tube 2a to house a plurality of semiconductor substrates 4 which can serve as members or components to be processed. Around the semiconductor substrate processing chamber 2, a plurality of semiconductor substrate processing chamber heaters 7 serving as processing chamber temperature adjustment devices are provided, and can adjust an internal temperature of the semiconductor substrate processing chamber 2 (e.g. to a predetermined temperature, or to a temperature based at least in part on a signal received from a controller). The peripheries of the semiconductor substrate processing chamber heaters 7 can be respectively completely or partially surrounded by respective heat insulators 8 which can help keep the internal temperature of the semiconductor substrate processing chamber 2 at a set temperature (e.g. can retain heat produced by the semiconductor substrate processing chamber heaters 7). Each semiconductor substrate processing chamber heater 7 and each heat insulator 8 can be configured to be able to make the internal temperature of the semiconductor substrate processing chamber 2 approximately uniform and/or constant. The CVD film forming apparatus according to the first aspect is a batch type processing apparatus configured to simultaneously process a plurality of semiconductor substrates. The film forming apparatus can simultaneously process any appropriate number of semiconductor substrates. For example, the number of semiconductor substrates simultaneously processed by one CVD film forming apparatus can be about 25 or greater.

The semiconductor substrates 4 can be housed in an inner center part of the inner tube 2b of the semiconductor substrate processing chamber 2 when loaded on the boat 3. The semiconductor substrates 4 are vertically stacked on the boat 3 and spaced apart from one another in the vertical direction. The boat 3 is attached to a semiconductor substrate processing chamber door 10 via a heat retention plate 9. The semiconductor substrate processing chamber door 10 can be moved by a door driving motor (not illustrated) along the vertical direction. By the vertical movement of the semiconductor substrate processing chamber door 10, it is possible to carry the boat 3 into or out from the semiconductor substrate processing chamber 2, that is, to carry the semiconductor substrates 4 into the semiconductor substrate processing chamber 2 and carry the semiconductor substrates 4 out from the semiconductor substrate processing chamber 2.

The semiconductor substrate processing chamber 2 is provided with a gas introduction pipe 11 which can introduce processing gas (e.g. reactant gas) into the semiconductor substrate processing chamber 2 when performing CVD film formation. A gas discharge pipe 12 is attached to the semiconductor substrate processing chamber 2 to discharge used processing gas to the outside of the semiconductor substrate processing chamber 2. The processing gas is introduced into the semiconductor substrate processing chamber 2 through the gas introduction pipe 11, passes through a region where the semiconductor substrates 4 are placed, and then is discharged out of the semiconductor substrate processing chamber 2 from the gas discharge pipe 12 as indicated by broken lines in FIG. 1. The processing gas can be sent to the gas introduction pipe 11 which is part of a gas supply device 13. An exhaust air pump and an on-off valve and the like (not illustrated) can be connected to the gas discharge pipe 12, so that the used processing gas is discharged out of the semiconductor substrate processing chamber 2 through the discharge pipe 12. For example, the used processing gas is discharged from the gas discharge pipe 12 by using the exhaust air pump, so that it is possible to allow the interior of the semiconductor substrate processing chamber 2 to be substantially in a vacuum state.

Figure 2A:
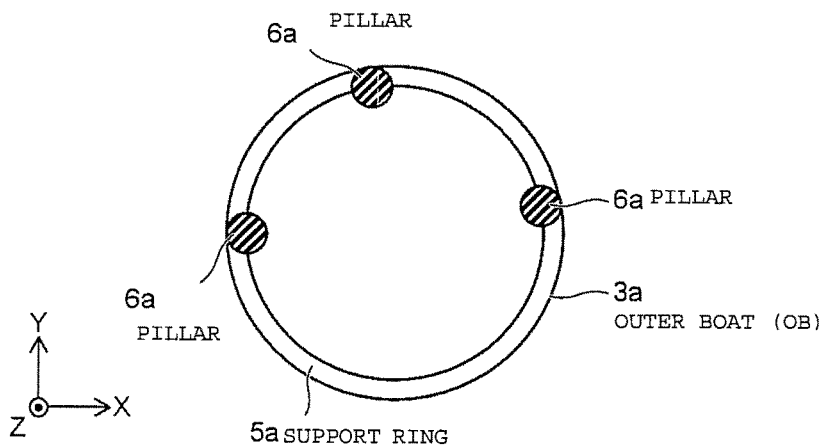
FIG. 2A, FIG. 2B and FIG. 2C are top views of embodiments of a boat part of the semiconductor manufacturing apparatus illustrated in FIG. 1.
Figure 2B:
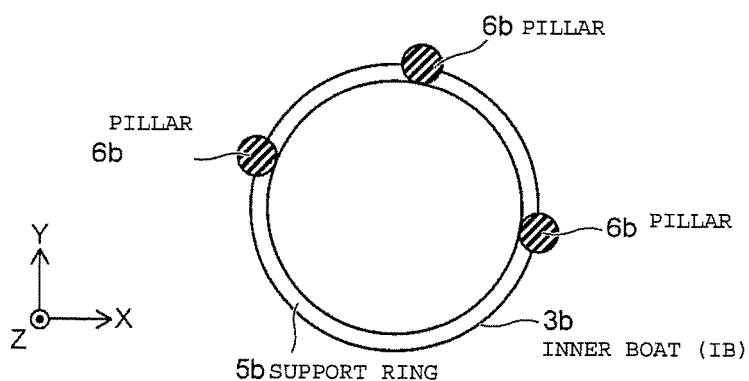
Figure 2C:
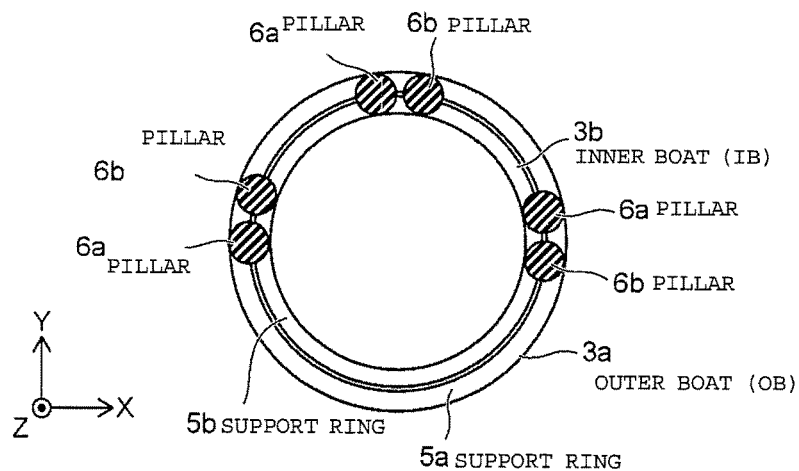

Hereinafter, the configuration of some embodiments of the boat 3 will be described with reference to FIGS. 2A, 2B and 2C illustrating its upper surface. The boat 3 includes an outer boat (OB) 3a and an inner boat (IB) 3b as illustrated in FIGS. 2A, 2B and 2C. As illustrated in FIG. 2A, the outer boat 3a is provided with a support ring 5a and three pillars 6a spaced apart from one another. The pillars 6a may protrude into an inner region of the support ring 5a. As illustrated in FIG. 2B, the inner boat 3b is provided with a support ring 5b and three pillars 6b spaced apart from one another. The pillars 6b may protrude to an outer region of the support ring 5b. As illustrated in FIG. 2C, the inner boat 3b is installed inside the outer boat 3a, thus at least partially configuring the boat 3. In the depicted configuration, the pillars 6b of the inner boat are disposed in the vicinity of the pillars 6a of the outer boat 3a in a one-to-one fashion. For example, each pillar 6a may have a respective neighboring pillar 6b that is closer the pillar 6a than is any other pillar of the boat 3. The pillars 6a of the outer boat 3a and the pillars 6b of the inner boat 3b can have substantially the same diameter, and all the center points of the pillars are substantially arranged on the same arc of a concentric circle.

Next, a configuration of some embodiments of the boat 3 will be described with reference to FIG. 3A that is a perspective view schematically illustrating the boat 3. Each pillar 6a of the outer boat 3a is provided with support protrusions 20a, which can be used for mounting the semiconductor substrates 4. Each pillar 6b of the inner boat 3b is provided with support protrusions 20b, which can be used mounting the semiconductor substrates 4. Each pillar 6a of the outer boat 3a is provided or disposed on both of a support ring 5a of the outer boat 3a and a support ring 5b of the inner boat 3b. Each pillar 6b of the inner boat 3b is provided or disposed on both of the support ring 5a of the outer boat 3a and the support ring 5b of the inner boat 3b.

The shape of the support protrusion will be described with reference to FIG. 3B that is an enlarged perspective view schematically illustrating a part of the pillar 6a of the outer boat 3a and the pillar 6b of the inner boat 3b in a region A identified by a broken line in FIG. 3A. As illustrated in FIG. 3B, the pillars 6a and 6b are respectively provided with a plurality of support protrusions 20a and 20b disposed along a Z direction that is a vertical direction, and the semiconductor substrates 4 can be placed on the support protrusion 20a and 20b.

The support protrusions can disposed in corresponding pairs including one protrusion 20a and one protrusion 20b disposed at a same "step" (e.g. disposed more closely in a vertical direction than are any other pair of a protrusion 6a and a protrusion 6b). A semiconductor substrate 4 may be placed on both protrusions of a corresponding pair of protrusions during a film deposition process. The upper surface of each support protrusion 20a can be disposed higher or lower than that of each respective corresponding support protrusion 20b by a height difference Hc. That is, for at least one pair (e.g. for every pair) of corresponding support protrusions, the upper surface of the support protrusion 20a is disposed at a different position than is the upper surface of the corresponding support protrusion 20b.

A length La of the support protrusion 20a of the outer boat 3a (e.g. a furthest extension of the support protrusion 20a away from the pillar 6a) is substantially the same as a length Lb of the support protrusion 20b of the inner boat 3b (e.g. a furthest extension of the support protrusion 20b away from the pillar 6b); however, in some embodiments the length La may not be substantially the same as the length Lb. A length between a position of a leading end E of the support protrusion 20a of the outer boat 3a and a center of a semiconductor substrate mounted on the support protrusion 20a is substantially the same as a length between a position of a leading end F of the support protrusion 20b of the inner boat 3b on which the semiconductor substrate is to be mounted and the center of a semiconductor substrate to be mounted. Each support protrusion can be shaped such that it is possible to place or mount the semiconductor substrate 4 by using one of the support protrusion having the upper surface which is positioned to be higher, even in the support protrusions of any one of the outer boat 3a and the inner boat 3b.

The semiconductor manufacturing apparatus of the present embodiment includes a pillar lifting device 30 as illustrated in FIG. 1. The pillar lifting device 30 lifts the inner boat 3b such that an upper surface position of a support protrusion 20b provided in the inner boat 3b is positioned below an upper surface position of a corresponding support protrusion 20a provided in the outer boat 3a, during a film forming process.

Each pillar 6a of the outer boat 3a includes a plurality of support protrusions 20a vertically provided in accordance with the number of semiconductor substrates 4 to be placed (e.g., a number of support protrusions equal to or greater than the number of semiconductor substrates 4 to be placed). At least three corresponding support protrusions 20a are provided in a same plane (e.g. in a substantially same plane, such as an X-Y plane) and can be used to support a semiconductor substrate 4. The upper surfaces of the corresponding support protrusions 20a are disposed at a substantially same height.

Each pillar 6b of the inner boat 3b includes a plurality of support protrusions 20b vertically provided in accordance with the number of the semiconductor substrates 4 to be placed (e.g., a number of support protrusions equal to or greater than the number of semiconductor substrates 4 to be placed). At least three corresponding support protrusions 20b are provided substantially in a same plane (e.g. the X-Y plane) and can be used to support a semiconductor substrate 4. The upper surfaces of the corresponding support protrusions 20b are disposed at a substantially same height.

Hereinafter, the following description will refer to the outer boat 3a and the inner boat 3b as a first boat and a second boat, respectively. In an initial step of a film forming process, upper surfaces of corresponding support protrusions 20a provided in the first boat 3a are positioned above (further in the Z direction than) upper surfaces of corresponding support protrusions 20b provided in the second boat 3b. A semiconductor substrate 4 is placed on the corresponding support protrusions 20a of the first boat 3a, and is separated from (e.g. not in contact with, and/or is held above) the corresponding support protrusions 20b of the second boat 3b.

The pillar lifting device 30 is provided below the heat retention plate 9 and can lift the second boat 3b. The pillar lifting device 30, for example, lifts the second boat 3b by using air pressure. The second boat 3b vertically moves along a rail 31. The pillar lifting device 30 lifts the support ring 5b of the second boat 3b via a connection body 32 which can support the support ring 5b at a plurality of positions. In the initial step of the film forming process, the upper surfaces of the support protrusions 20b of the second boat 3b are positioned down in the Z direction as compared with the upper surfaces of the corresponding support protrusions 20a of the first boat 3a. Thereafter, the pillar lifting device 30 can raise or lower the second boat 3b by increasing or lessening the supply of the air pressure.

In the case of vertically moving the first boat 3a instead of the second boat 3b, the first boat 3a is lifted instead of the second boat 3b. The pillar lifting device 30, for example, lifts the first boat 3a by using air pressure. The first boat 3a vertically moves along the rail 31. In some other embodiments, the first boat 3a moves along a different rail than the rail 31 along which the second boat 3b moves. The pillar lifting device 30 lifts the support ring 5a of the first boat via the connection body 32 which can support the support ring 5a at a plurality of positions. In the initial step of the film forming process, the upper surfaces of the support protrusions 20a of the first boat 3a are positioned down in the Z direction as compared with the upper surfaces of the corresponding support protrusions 20b of the second boat 3b. Thereafter, the pillar lifting device 30 can raise or lower the first boat 3a by increasing or decreasing the supply of the air pressure.

As described above, by the pillar lifting device 30, it is possible to move up or down the first boat 3a or the second boat 3b such that the vertical position of one of the first boat 3a and the second boat 3b with respect to the vertical position of the other thereof is reversed. In other words, the first boat 3a and/or the second boat 3b can be moved such that corresponding support protrusions of one of the first boat 3a and the second boat 3b that were positioned above corresponding support protrusions of the other boat are lowered below the corresponding support protrusions of the other boat. That is, the first boat 3a or the second boat 3b is moved up or down by a height substantially the same as or more than a height difference Hc between the upper surface of the support protrusion 20a of the first boat 3a and the upper surface of the support protrusion 20b of the second boat 3b. In such an operation, a portion of a rear surface of the semiconductor substrate 4 in contact with and covered by support protrusions of one of the first boat 3a and the second boat 3b become uncovered. By this operation, it is possible to change a contact region between a rear surface of the semiconductor substrate 4 and the surface of the support protrusion 20 of the boat 3 during the film forming process.

The pillar lifting device 30 is controlled by a control device 33. The control device 33 includes a film formation time management device 34 for managing a film formation time. The film formation time management device 34 sets in advance a time specified for film formation, manages (e.g. monitors and/or tracks) the passage of time from film formation start. The control device 33 can cause the pillar lifting device 30 to apply high pressure air to the second boat 3b once a predetermined amount of time has passed, such as approximately at a halfway point in a predetermined film formation time, thereby lifting the second boat 3b. When the predetermined film formation time is reached, the control device 33 can stop the supply of the processing gas to the semiconductor substrate processing chamber 2. The lifting timing of the second boat is not always the halfway point of the predetermined film formation time, and can be set as appropriate. In some embodiments, the control device 33 can be implemented using a processor and a memory storing instructions executable by the processor In the presently described embodiments, the boat 3 includes an inner and outer double boat structure and each structure can independently move in the vertical direction, so that the second boat 3b is lifted in the middle of film formation, thereby changing a state in which the semiconductor substrates 4 are placed on the support protrusions 20a of the first boat 3a to a state in which the semiconductor substrates 4 are placed on the support protrusions 20b of the second boat. By so doing, a film can be formed at a portion of rear surfaces of the semiconductor substrates 4 in which no film is formed in the state in which the semiconductor substrates 4 are placed on the first boat 3a, so that film formation is performed for the entire rear surfaces of the semiconductor substrates.

In the presently described embodiments, the material of each boat may include SiC (silicon carbide) or quartz, or other material having suitable heat resistance and strength. The difference Hc between the height of the upper surface of the semiconductor substrate support protrusion 20a of the first boat 3a and the height of the semiconductor substrate support protrusion 20b of the second boat 3b (e.g. at a stage in the film formation process when the positions of first boat 3a and the second boat 3b are substantially fixed) can be small (e.g. about several tens of micrometers or less). Furthermore, the upward movement distance of the second boat 3b with respect to the first boat 3a of the present embodiment can be small (e.g. about several tens of micrometers or less), and can be sufficient to cause the height of the upper surface of the semiconductor substrate support protrusion 20a of the first boat 3a and the height of the upper surface of the semiconductor substrate support protrusion 20b of the second boat 3b are reversed.

The number of support protrusions for supporting one semiconductor substrate 4 at a given time may be any appropriate number such as, for example, two or three, or a number higher than 3. In some implementations, at least one distance between two corresponding support protrusions is larger than a diameter of the semiconductor substrate 4 so that carrying in and out of the semiconductor substrate 4 can be performed. In each of the first boat 3a and the second boat 3b, there is a distance between corresponding two support protrusions which is larger than the diameter of the semiconductor substrate 4. At least one of the first boat 3a and the second boat 3b may be capable of rotating relative to the other boat, such that it is possible to obtain a space for carrying in and out of the semiconductor substrate 4.

The relative position of the pillars of each of the first boat 3a and the second boat 3b may not be fixed. For example, at least one of the first boat 3a and the second boat 3b may be allowed to rotate, resulting in a change in a distance between the pillars of the first boat 3a and the second boat 3b. Furthermore, the number of boats is not limited to 2, and three or more boats can be provided, and it may be possible to vertically move one or more boats. In the above description, an operation for raising or lowering the second boat is described; however, in some implementations an operation for raising or lowering the first boat may be performed, and the second boat may not be configured for vertical movement.

According to the presently described embodiments, for semiconductor substrates, support protrusions for supporting each semiconductor substrate are provided in pillars of two boats, so that the support protrusions on which the semiconductor substrates are placed changes as the boats are vertically moved relative to each other and thus it is possible to form a film on substantially an entire rear surface of the semiconductor substrates during film formation.

When film formation is performed on a semiconductor substrate without employing the presently described embodiments, it is possible that dust due to film peeling will be generated. It is possible that, in forming a plurality of films, a thin film will be partially formed on the rear surface of the semiconductor substrate (e.g. rather than a film of full thickness, due to some portion of the rear surface being covered during a film forming process). Then, when etching is performed on the partially formed film to expose an internal etching target film (that is e.g. covered by the partially formed film), it is possible that at least a portion of the internal etching target film is undesirably removed. In this case, it is possible that dust will be generated due to excessive peeling of a film of a surface not meant to be subjected to etching. In contrast, the CVD film forming apparatus of the presently described embodiments solves the aforementioned problem that an irregular state occurs in the rear surface of the semiconductor substrate due to the semiconductor substrate support part.

Figure 4:
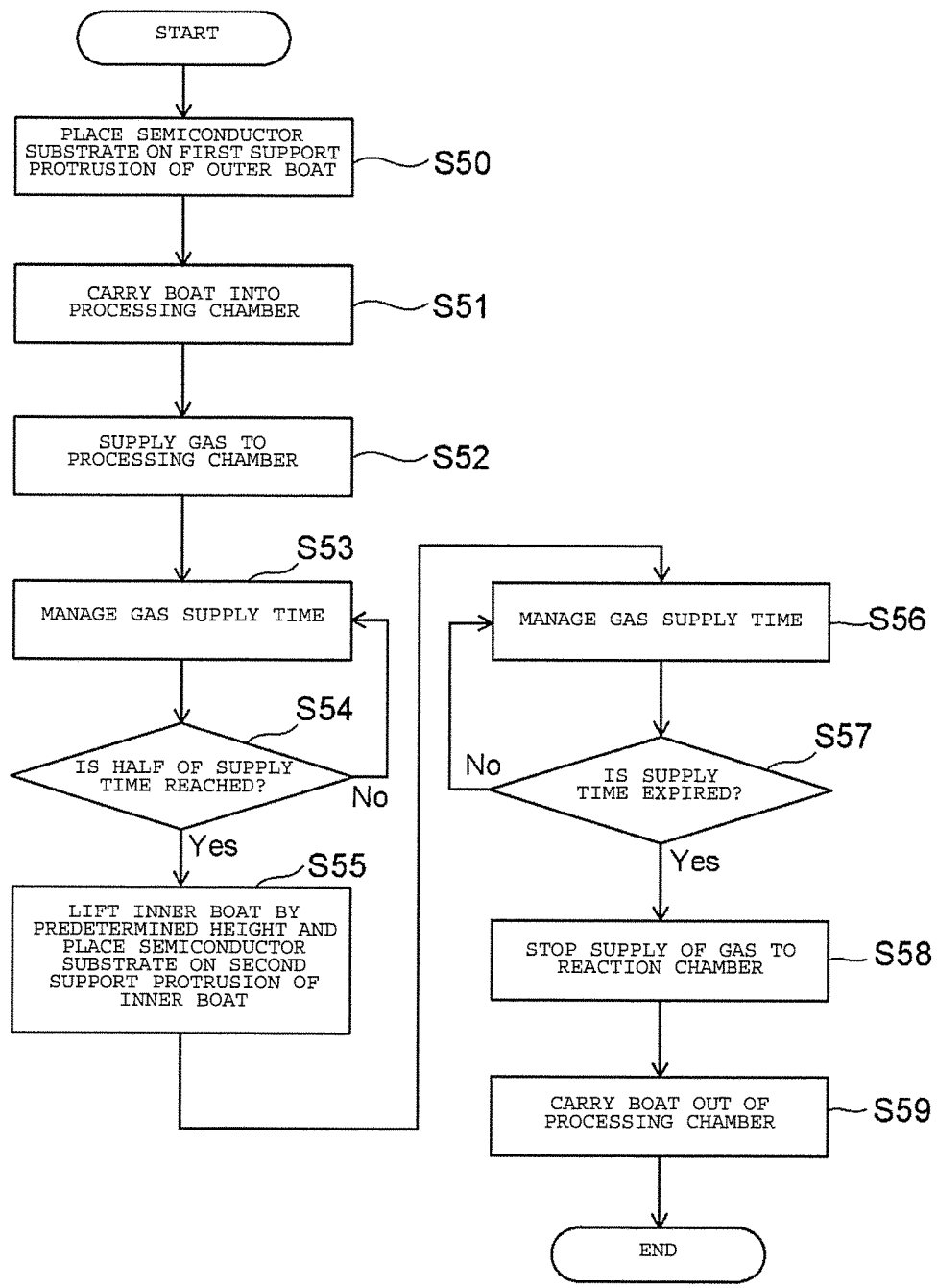
FIG. 4 is a flowchart illustrating embodiments of a manufacturing method of the semiconductor manufacturing apparatus according to the first aspect.

Next, a manufacturing method of a semiconductor device in the presently described embodiments will be described using a flowchart illustrated in FIG. 4. A number of semiconductor substrates 4 to be simultaneously subjected to a film formation process are placed on the upper surfaces of the support protrusions 20a provided in a first boat 3a (S50). Next, the semiconductor substrates 4 to be subjected to the film formation process are carried into a processing chamber of a CVD film forming apparatus (S51). Next, processing gas is supplied to the processing chamber of the CVD film forming apparatus and formation of a film, such as a silicon nitride film, begins on surfaces of the semiconductor substrates 4 (S52). Next, an elapsed time is monitored by a film formation time management device 34 (S53).

Next, the film formation time management device 34 detects that a time T1 has elapsed (S54). The time T1 can correspond to a preset or predetermined processing time that is approximately half of an overall time for a film formation process (e.g. a predetermined gas supply time T), or can correspond to another appropriate time. The film formation time management device 34 can inform a controller of that the time T1 has elapsed, and the controller can cause a second boat 3b to rise by a predetermined amount (S55). By the lifting operation of the second boat, the semiconductor substrates 4 are changed from the state of being placed on the support protrusions 20a provided in the first boat 3a to the state of being placed on support protrusions 20b provided in the second boat 3b.

Next, the film formation time management device 34 monitors an elapsed time at least until a predetermined gas supply time T is expired (S56). Next, the film formation time management device 34 determines that the predetermined gas supply time T has elapsed (S57). Next, the film formation time management device 34 can inform the controller that the time T has elapsed, and the controller can stop the supply of gas to the CVD film forming apparatus (S58).

Next, the semiconductor substrates subjected to the film formation are carried out of the CVD film forming apparatus (S59).

By the manufacturing method of the semiconductor device of the presently described embodiments describe above, it is possible to manufacture a semiconductor device by a process that suppresses an irregular film formation state on the rear surface of a semiconductor substrate.

According to the presently described embodiments, the semiconductor substrate is not taken out of the CVD film forming apparatus and boat contact points of the rear surface of the semiconductor substrate are changed during the process, so that it is possible to perform film deposition on the rear surface of the semiconductor substrate (e.g. on substantially the entire rear surface) such that impurities of an film deposition interface are reduced. Thus, reduction of impurities of the film deposition interface can be effectuated while improving productivity. Accordingly, in an area at or near a contact region of a semiconductor substrate mounting jig, it is possible to suppress dust due to film peeling caused by a part on the rear surface of a semiconductor substrate being covered by a film is only partially formed, or not formed.

(Modification Example)

Figure 3A:
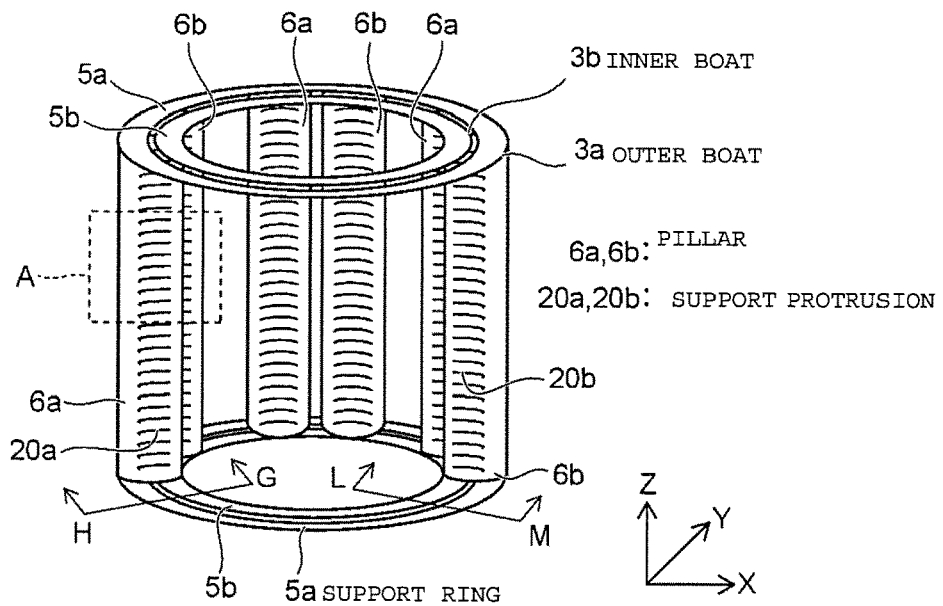
FIG. 3A and FIG. 3B are oblique perspective views of the embodiments of the boat part shown in FIG. 2A, FIG. 2B and FIG. 2C.
Figure 3B:
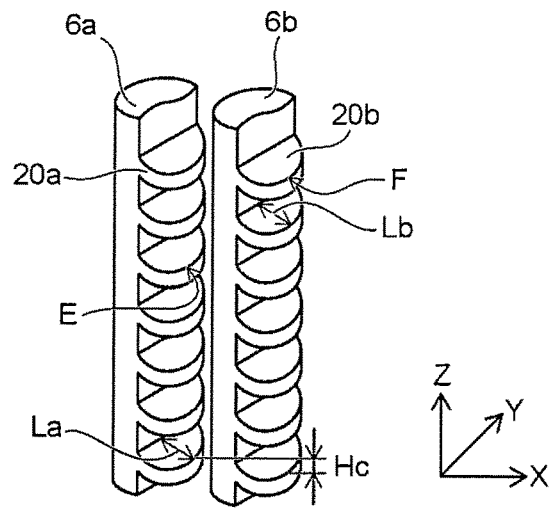
Figure 5:
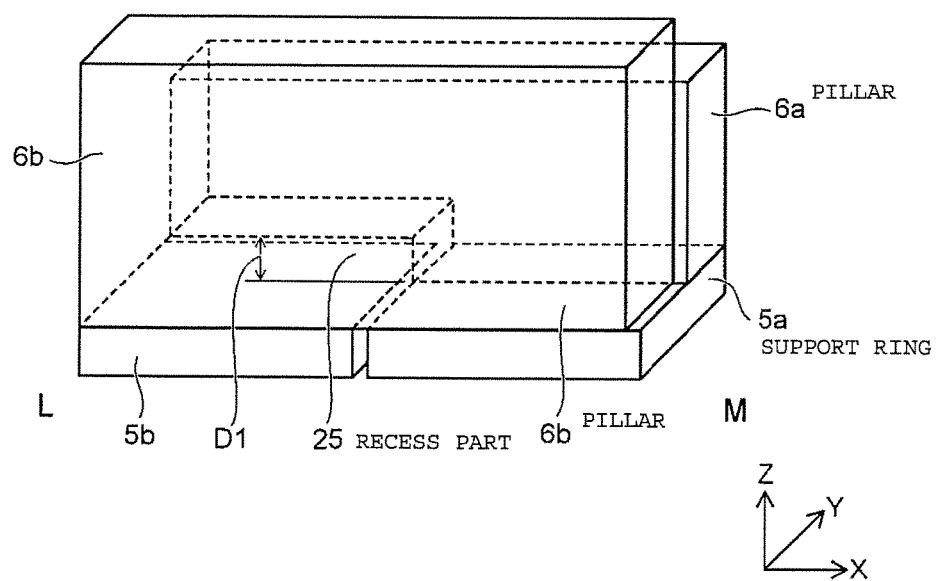
FIG. 5 is an oblique perspective view of embodiments of a part of a support ring and a pillar in a modification example of the semiconductor manufacturing apparatus according to the first aspect.

FIG. 5 is a perspective view illustrating embodiments of the inner boat 3a and the outer boat 3b from a side view when support rings and pillars in the vicinity of the support ring are cut in a direction L-M, as shown in FIG. 3A according to a modification example of the first embodiment. As illustrated in FIG. 5, a recess portion (a dent) 25 is formed on the bottom surface of the pillar 6a at a part adjacent to (e.g. disposed over) the support ring 3b.

The pillar 6a provided in the outer boat 3a is formed with the recess portion 25 having a distance D1 (depth of recess) that can accommodate an outer peripheral portion of the support ring 5b of the inner boat 3b when the inner boat 3b is lifted. FIG. 5 illustrates a distance D1 between the upper surface of the support ring 5b and the bottom surface of the pillar 6a of the outer boat 3a at a time when the upper surface of the support ring 5b and an upper surface of the support ring 5a are substantially co-planar. Thus, even though the pillar 6a provided in the outer boat 3a overlaps (e.g. covers or is disposed over) the support ring 5b of the inner boat 3b in the X-Y direction, the inner boat 3b can move in the Z direction. The distance D1 is set to be larger than the difference Hc between the heights (e.g. a vertical (Z direction) position) of the upper surface of the support protrusion 20a of the outer boat 3a and the upper surface of the support protrusion 20b of the inner boat 3b. In this way, it is possible to change (e.g. reverse) a relative position of the heights of the upper surface of the support protrusion 20a of the outer boat 3a and the upper surface of the support protrusion 20b of the inner boat 3b.

Figure 6A:
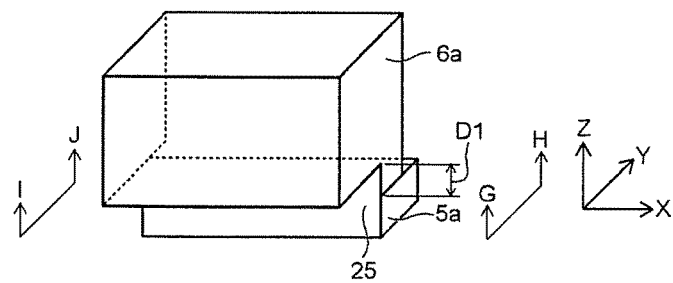
FIG. 6A, FIG. 6B, FIG. 6C and FIG. 6D are oblique perspective views and section views of embodiments of a part of the support ring and the pillar in the modification example of the semiconductor manufacturing apparatus according to the first aspect.
Figure 6B:
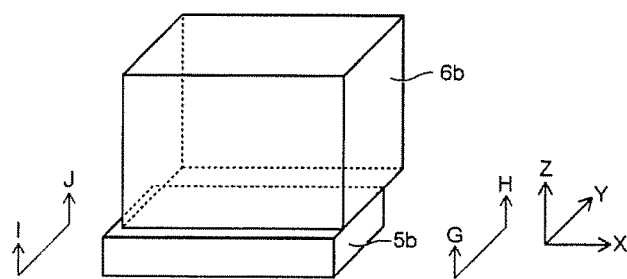
Figure 6C:
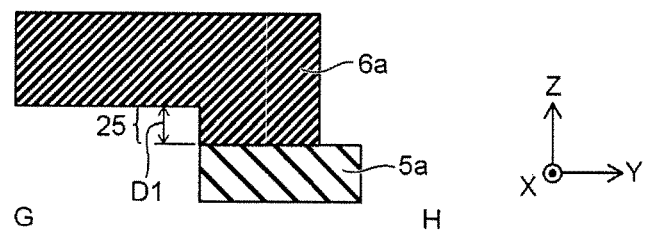
Figure 6D:
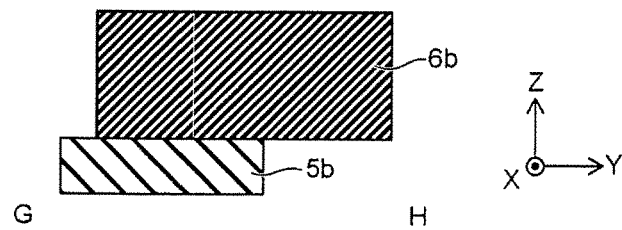

FIG. 6A is a perspective view of embodiments of the lower part of the pillar 6a being supported by the support ring 5a. FIG. 6B is a perspective view of embodiments of the lower part of the pillar 6b being supported by the support ring 5b. FIG. 6C illustrates a sectional view in a radial direction of embodiments of the lower part of the pillar of the outer boat 3a and the support ring 5a provided in the lower part thereof. The outer periphery of the support ring 5a protrudes outward (away from a center of the support ring 5a) from the pillar 6a (e.g. is not covered by the pillar 6a), and the pillar 6a protrudes inward (towards a center of the support ring 5a), thus defining the recess portion 25 of the pillar 6a. FIG. 6D illustrates a sectional view in a radial direction of embodiments of the pillar 6b of the inner boat 3b and the support ring 5b provided in the lower part thereof. The outer side surface of the pillar 6b protrudes outward from the support ring 5b. In FIGS. 6A, 6B, 6C and 6D, the support rings 5a and 5b are illustrated in the vicinity of the pillars 6a and 6b, and the pillars 6a and 6b are illustrated in the vicinity of the support ring. Although not illustrated in FIGS. 6A, 6B, 6C and 6D, the support rings 5a and 5b have a similar overall configuration as depicted in FIG. 5.

Figure 7A:
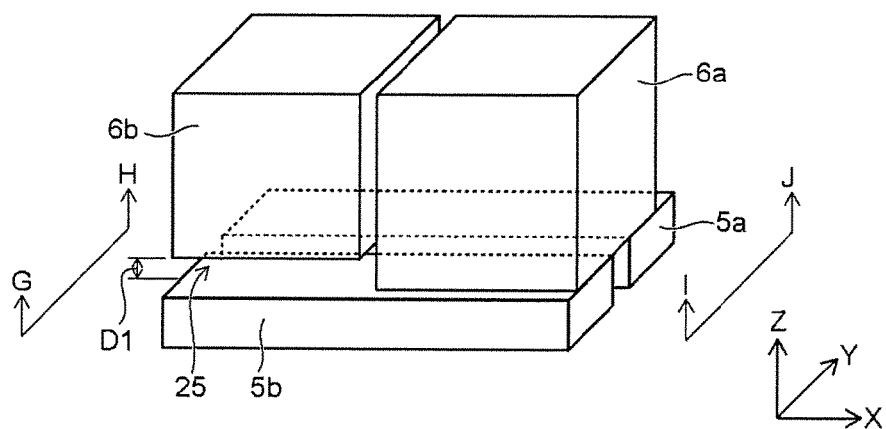
FIG. 7A and FIG. 7B are oblique perspective views of embodiments a part of the support ring and the pillar in the modification example of the semiconductor manufacturing apparatus according to the first aspect.
Figure 7B:
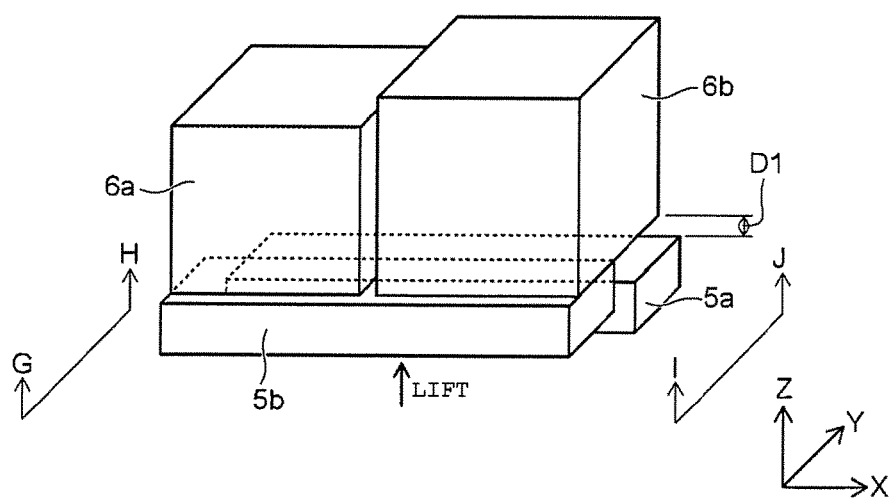

FIG. 7A is a perspective view of embodiments of the boat 3a and the boat 3b from the inner boat 3b side, and corresponds to a state in which the semiconductor substrate 4 is placed on (e.g. is in contact with) the support protrusion 20a of the outer boat 3a. A bottom surface of the support ring 5a of the outer boat 3a is substantially co-planar with a bottom surface of the support ring 5b of the inner boat 3b. Although not illustrated in the drawing, the upper surface of the support protrusion 20a of the support ring 5a of the outer boat 3a is positioned above (in the upper Z direction) the upper surface of the support protrusion 20b of the support ring 5b of the inner boat 3b. Thereafter, as illustrated in FIG. 7B which is a perspective view of embodiments of the boat 3a and the boat 3b in a state in which the inner boat is lifted, the upper surface of the support ring 5a of the outer boat 3a is positioned below (in the Z direction) the upper surface of the support ring 5b of the inner boat 3b. In this case, the support ring of the inner boat 3b is inserted into the recess portion 25 formed in the lower part of the pillar of the outer boat 3a.

Figure 8A:
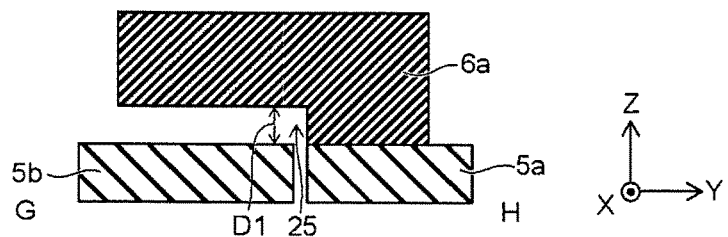
FIG. 8A, FIG. 8B, FIG. 8C and FIG. 8D are sectional views of embodiments of apart of the support ring and the pillar in the modification example of the semiconductor manufacturing apparatus according to the first aspect.
Figure 8B:
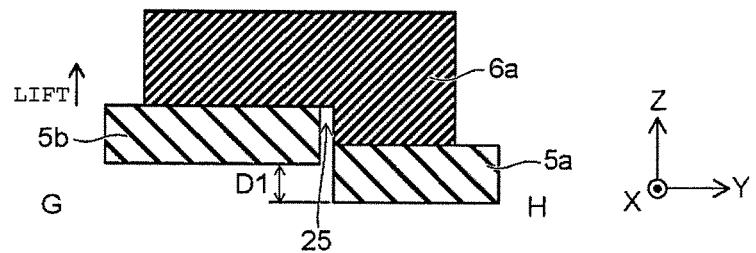
Figure 8C:
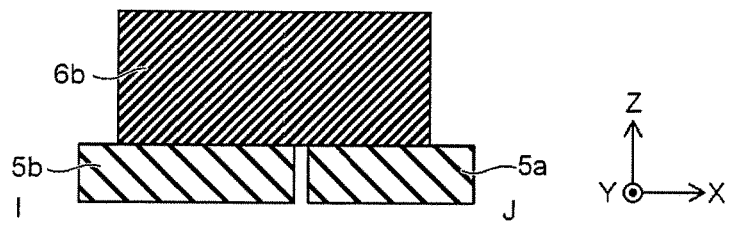
Figure 8D:
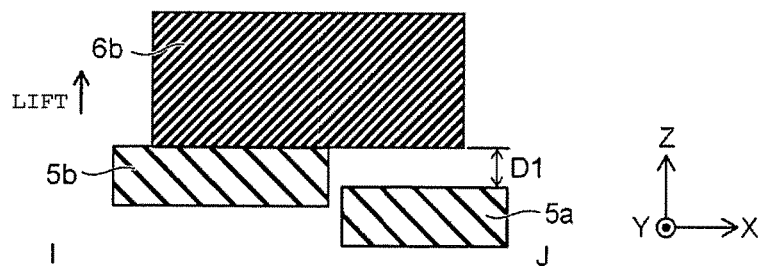

FIG. 8A illustrates a sectional view in a radial direction of embodiments of the support rings at the G-H side of FIG. 7A. Below the recess portion 25, the outer peripheral portion of the support ring 5b of the inner boat 3b is positioned. FIG. 8B illustrates a sectional view in a radial direction of embodiments of the support ring at the G-H side of FIG. 7B. The upper surface of the outer peripheral side of the support ring 5b of the inner boat 3b is positioned such that the support ring 5b of the inner boat 3b is lifted in the recess portion 25 and is in contact with the lower surface of the pillar 6a of the outer boat 3a, which defines, in part, the recess portion 25. FIG. 8C illustrates a sectional view in a radial direction of embodiments of the support ring at the I-J side of FIG. 7A. The pillar 6b of the inner boat 3b is placed on the support ring 5a of the outer boat and the support ring 5b of the inner boat. In FIG. 8D, the depicted embodiments of the support ring 5b of the inner boat 3b are lifted and the lower bottom surface of the pillar 6b is positioned apart from the support ring 5a of the outer boat 3a by the distance D1. In FIGS. 8A, 8B, 8C and 8D, the support ring 5 is illustrated in the vicinity of the pillar and the pillar 6 is illustrated in the vicinity of the support ring. Although not illustrated in the drawings, the support ring 5 has a similar overall configuration as that depicted in FIGS. 7A and 7B in regions.

Thus, in the lifting operation of the inner boat 3b, the lifted position of the inner boat 3b can be accurately stopped at the position of the bottom surface of the pillar 6a of the outer boat 3a, which faces the recess portion 25. That is, even though the pillar of the outer boat 3a is placed on the support rings 5a and 5b of both the outer boat and the inner boat and the pillar 6b of the inner boat 3b is placed on the support rings 5a and 5b of both the outer boat 3a and the inner boat 3b, it is possible to prevent the state in which the support ring 5b of the inner boat 3b is not lifted because it is blocked by the pillar 6a of the outer boat 3a on the support ring 5b, and to control the degree of lifting of the inner boat 3b to be substantially the same as the height D1 of the recess portion 25. In the above description, the configuration of the lower side of the boat 3 in the vicinity of the support ring 5 is described. A configuration of an upper side of the boat 3 in the vicinity of the support ring 5 is reverse to (or reciprocal to) the configurations shown in FIGS. 5, 6A, 6B, 6C, 6D, 7A, 7B, 8A, 8B, 8C and 8D. That is, the recess portion 25 is formed in the upper part of the pillar 6b to be spaced apart from the lower side of the upper support ring 5a of the outer boat 3a by the distance D1. By so doing, the upper part of the pillar 6b of the inner boat 3b is disposed below the support ring 5a of the outer boat 3a. Below the support ring 5b of the inner boat 3b, the pillar 6a of the outer boat 3a is disposed so as to be in contact with a bottom surface of the support ring 5b. By so doing, even though the pillar 6b of the inner boat 3b is lifted, the pillar 6b of the inner boat 3b is permitted to be lifted by the distance D1 and is not additionally lifted by the support ring 5a of the outer boat 3a, so that the bottom surface of the upper support ring 5a of the outer boat 3a serves as a locking part of the inner boat 3b.

As described above, when the pillar of the inner boat 3b is lifted, the lifting region of the support ring 5b of the inner boat 3b can be received in the recess portion 25 provided in the lower portion of the lower pillar 6a of the outer boat 3a. The recess portion 25 provided in the lower portion of the lower pillar 6a of the outer boat 3a serves as a locking part of the support ring 5b of the inner boat 3b. Furthermore, when the pillar of the inner boat 3b is lifted, the lifting region of the support ring 5b of the inner boat 3b can be received in the recess portion 25 provided in the upper portion of the upper pillar 6b of the inner boat 3b. That is, the recess portion 25 provided in the upper portion of the upper pillar 6b of the inner boat 3b and the bottom surface of the upper support ring 5a serve as a locking part of the pillar 6b of the inner boat 3b. In the aforementioned description, the operation for moving up and down the inner boat 3b is described; however, in the case of performing an operation for moving up and down the outer boat 3a, the position of the recess portion 25 are disposed reversely to the states described in FIGS. 5, 6A, 6B, 6C, 6D, 7A, 7B, 8A, 8B, 8C and 8D. That is, the recess portion 25 is provided in the lower portion of the pillar 6b of the inner boat 3b and is not provided in the lower portion of the pillar 6a of the outer boat 3a, so that the pillar 6a enters a state of being placed on the support ring 5b. Moreover, the recess portion 25 is provided in the upper pillar 6a of the outer boat 3a and is not provided in the upper portion of the upper pillar 6b of the inner boat 3b, so that the upper pillar 6b enters a state of being placed below the support ring 5a.

(Second Aspect)

Hereinafter, components similar to those of the semiconductor manufacturing apparatus according to the aforementioned first aspect are denoted by the same reference numerals and a detailed description thereof is omitted. The presently described embodiments according to a second aspect are described below, and have a the schematic configuration similar to that illustrated in FIG. 1. In the presently described embodiments, as illustrated in FIG. 9A in which a boat 56 is obliquely viewed, the boat 56 has support rings 5 provided at the top end and the bottom end thereof, a group of first pillars 50 provided apart from each other between the top and bottom support rings 5, a second pillar 51 provided apart from the group of first pillars 50, and a third pillar 52 provided apart from the group of first pillars 50 and the second pillar 51. In the first embodiment, the second boat can be moved up and down. In the presently described embodiments, the second pillar 51 and the third pillar 52 can be moved up and down. This can help to position semiconductor substrates appropriately in a semiconductor manufacturing apparatus.

As illustrated in FIG. 10 which is a plan view illustrating an upper surface of the boat 56, the group of first pillars 50 is provided with a plurality of first support protrusions 61, 62 and 63 on which semiconductor substrates 4 can be placed, and the second pillar 51 is provided with a second support protrusion 64 having an area of a semiconductor substrate placement region larger than at least one of (e.g. any of) the areas of semiconductor substrate placement regions of the plurality of first support protrusion. An upper surface position of the second support protrusion 64 is movable to a position higher than those of the plurality of support protrusions. The third pillar 52 is provided with a third support protrusion 65 having an area of a semiconductor substrate placement region larger than at least one of the areas of the semiconductor substrate placement regions of the plurality of first support protrusions. An upper surface position of the third support protrusion 65 is movable to a position higher than those of the first support protrusions.

In embodiments according to the second aspect, in an initial state, the semiconductor substrate 4 is placed on the first support protrusions 61, 62 and 63. Since the upper surfaces of these first support protrusions 61, 62 and 63 are substantially level with one another in the Z direction, the semiconductor substrate 4 is substantially horizontally held in the Z direction. When the second support protrusion 64 is lifted, the semiconductor substrate 4 is slightly inclined down to the Z direction toward a part 62 (the first support protrusion positioned to face the second support protrusion 64) of the first support protrusions 61, 62 and 63 from the second support protrusion 64. Since a difference between heights of the upper surface of the first support protrusion 62 and the upper surface of the second support protrusion 64 is small (e.g. about several tens of micrometers or less), the semiconductor substrate 4 remains in contact with the support protrusions 62 and 64 by this inclination. The width of the second support protrusion 64 in the X-Y direction can be about at least twice as wide as the width of one of the first support protrusions in the X-Y direction, which can allow the second support protrusion 64 to support the semiconductor substrate 4. The second pillar 51 provided with the second support protrusion 64, for example, can receive high pressure air as illustrated in FIG. 9B, which is an enlarged view of a part of the support ring 5 shown in FIG. 9A, thereby performing a move-up operation corresponding to a distance D2, and the supply of the high pressure air can be stopped or reduced, so that the second pillar 51 performs a move-down operation corresponding to the distance D2.

When the third support protrusion 65 is moved up and the second support protrusion 64 is moved down, the semiconductor substrate 4 is slightly inclined down to the Z direction toward a part 63 (the first support protrusion positioned to face the third support protrusion) of the first support protrusion group from the third support protrusion 65. Since a difference between heights of the upper surface of the first support protrusion and the upper surface of the third support protrusion is about several tens of micrometers or less, the semiconductor substrate 4 does not deviate from the support protrusions 63 and 65 by this inclination. The width of the third support protrusion in the X-Y direction can be about twice as wide as the width of one of the first support protrusions in the X-Y direction, which can allow the third support protrusion to support the semiconductor substrate 4. Similarly to the second support protrusion 64, the third support protrusion 65, for example, can receive high pressure air, thereby performing a move-up operation corresponding to the distance D2, and the supply of the high pressure air can be stopped or reduced, so that the third support protrusion 65 performs a move-down operation corresponding to the distance D2.

In embodiments according to the second aspect, in relation to a semiconductor substrate rear surface film deposition time, substantially all of the semiconductor substrate rear surface on the second support protrusion 64, the semiconductor substrate rear surface on the third support protrusion 65, and the semiconductor substrate rear surface on the first support protrusion 61 not facing the second support protrusion 64 and the third support protrusion 65 are each exposed for film formation for approximately ⅓ of an entire film formation time. On the other hand, the semiconductor substrate rear surface on the first support protrusions 62 and 63 facing the second support protrusion 64 or the third support protrusion 65 are each exposed for film formation for approximately to ⅔ of the entire film formation time. In the presently described embodiments, since substantially all the rear surface regions of the semiconductor substrates 4 placed on the surfaces of the first support protrusions 61, 62 and 63, the second support protrusion 64, and the third support protrusion 65 are exposed to gas, films are formed on substantially the entire surfaces of the rear surface regions.

As described above, it is possible to prevent a region with no film from being generated on a semiconductor substrate rear surface, so that it is possible to prevent dust from occurring from the semiconductor substrate rear surface. In addition, in the second embodiment, the film deposition times in the semiconductor substrate rear surface on the second support protrusion 64, the semiconductor substrate rear surface on the third support protrusion 65, and the semiconductor substrate rear surface on the first support protrusion 61 not facing the second support protrusion 64 and the third support protrusion 65 do not necessarily correspond to ⅓ of the entire film formation time, and the exposure times can be set as appropriate. Furthermore, the film formation times of the first support protrusions 62 and 63 facing the second support protrusion 64 or the third support protrusion 65 do not necessarily correspond to ⅔ and the exposure times can be set as appropriate.

Figure 11:
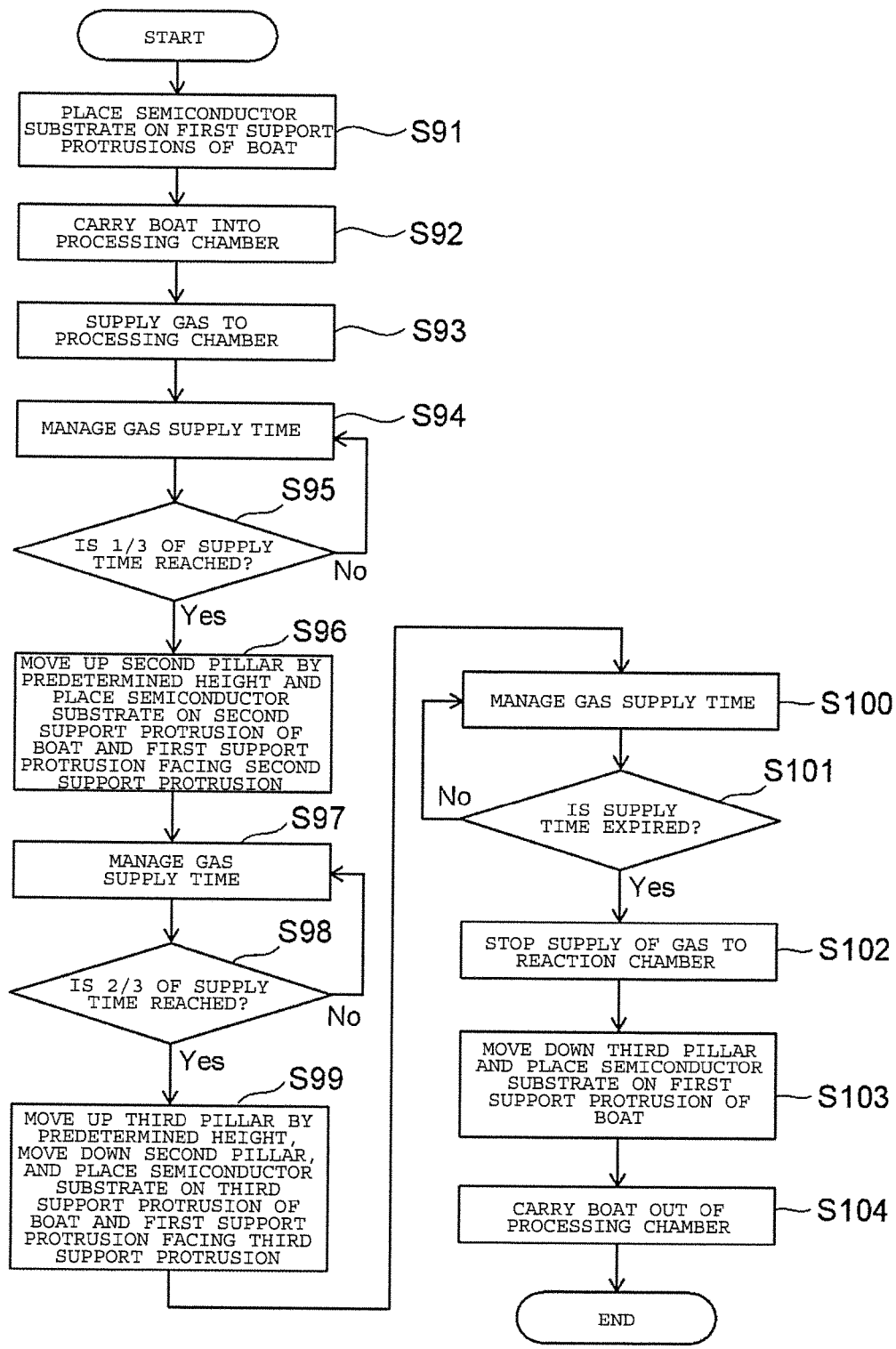
FIG. 11 is a flowchart illustrating embodiments of a manufacturing method of the semiconductor manufacturing apparatus according to the second aspect.

Next, embodiments of a manufacturing method a semiconductor device according to the second aspect will be described in reference to a flowchart illustrated in FIG. 11. A desired number of semiconductor substrates 4 to be simultaneously subjected to film formation are placed on the first support protrusions 61, 62 and 63 provided in the group of first pillars 50 (S91). Next, semiconductor substrates 4 to be subjected to the film formation process are carried in to the processing chamber 2 of the CVD film forming apparatus 1 (S92). Next, CVD gas is supplied to the CVD film forming apparatus (S93). Next, the film formation time management device 34 monitors passage of the time until about ⅓ (of a predetermined CVD gas supply time (T2) passes (S94). Next, the film formation time management device 34 confirms the passage of the aforementioned time T2 (S95). The time T2 is not limited to being about 1/3 of the predetermined CVD gas supply time passes, and is a time which can be set as appropriate.

Next, after confirming the time T2, the pillar lifting device 30 is controlled to move up the second pillar 51 (S96). The semiconductor substrates 4 placed on the first support protrusions 61, 62 and 63 provided in the group of first pillars 50 are changed to a state of being placed on the second support protrusion 64 provided in the second pillar 51 and at least the support protrusion 62 provided in the group of first pillars 50. In this case, on the upper surfaces of the support protrusions provided in the group of first pillars 50 and the upper surface of the support protrusion provided in the second pillar 51, the protrusion of the second pillar is positioned above in the Z direction. Therefore, the semiconductor substrates 4 are not horizontal in the Z direction, and are slightly inclined to the direction of one first pillar of the group of first pillars, which faces the second pillar, from the second pillar.

Next, the film formation time management device monitors passage of the time until about ⅔ of the predetermined CVD gas supply time (T3) passes (S97). Next, the film formation time management device 34 confirms the passage of the aforementioned time T3 (S98). Next, after confirming the time T3, the pillar lifting device 30 is controlled to move up the third pillar 52 and move down the second pillar 51 (S99). The semiconductor substrates 4 placed on the support protrusion 62 provided in one pillar of the group of first pillars 50 and the second support protrusion 64 provided in the second pillar 51 are changed to a state of being placed on the support protrusion 65 provided in the third pillar 52 and at least the support protrusion 63 provided in the group of first pillars, which are facing parts, in the X-Y direction. In this case, on the upper surface of the support protrusion 63 provided in the group of first pillars 50 and the upper surface of the support protrusion 65 provided in the third pillar 52, the protrusion of the third pillar 52 is positioned above in the Z direction. Therefore, the semiconductor substrates 4 are not horizontal in the Z direction, and are slightly inclined to the direction of one first pillar of the group of first pillars, which face the third pillar, from the third pillar. The time T3 is not limited to the being about ⅔ of the predetermined CVD gas supply time passes, and the tie T3 can be set as appropriate.

Next, the film formation time management device 34 monitors whether a predetermined CVD gas supply time T4 is exceeded (S100). Next, the film formation time management device 34 confirms the passage of the aforementioned time T4 (S101). The film formation time management device 34 confirms the aforementioned time T4 and then substantially stops the supply of the gas to the CVD film forming apparatus (5102). After the supply of the gas is stopped, the control device 33 controls the pillar lifting device 30 to move down the third pillar 52 (S103). Next, the semiconductor substrates 4 subjected to the film formation are carried out of the CVD film forming apparatus (S104).

According to the presently described embodiments, similarly to embodiments according to the first aspect, semiconductor substrates are not taken out of the CVD film forming apparatus and the boat contact regions of the rear surfaces of the semiconductor substrates are changed, so that it is possible to deposit a film on the semiconductor substrate rear surface side, and to reduce impurities of the film deposition interface while improving productivity.

Some semiconductor substrates described herein have been described as being circular in shape (e.g. as having a diameter). However, other semiconductor substrate shapes are possible. In such a case, the above description is still be applicable (e.g. by assuming the term "diameter" refers to a longest extension of a semiconductor substrate).

In the description of some embodiments, a component provided "on" or "over" another component can encompass cases where the former component is directly on (e.g., in physical contact with) the latter component, as well as cases where one or more intervening components are located between the former component and the latter component.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure. The respective embodiments may be implemented in combination with each other. Moreover, some or all of the above described embodiments can be combined when implemented.

What is claimed is:

1. A semiconductor manufacturing apparatus comprising:
a semiconductor substrate processing chamber;
a gas supply device configured to supply semiconductor substrate processing gas to the semiconductor substrate processing chamber;
a first boat provided in the semiconductor substrate processing chamber, the first boat including a top support ring and a bottom support ring respectively provided at a top end and a bottom end of the first boat, and a plurality of pillars spaced apart from one another provided between the top support ring and bottom support ring, the plurality of pillars being provided with support protrusions on which a semiconductor substrate can be placed;
a second boat provided in the semiconductor substrate processing chamber, the second boat including a top support ring and bottom support ring respectively provided at a top end and a bottom end of the second boat and a plurality of pillars spaced apart from one another provided between the top support ring and bottom support ring, the plurality of pillars being provided with support protrusions on which the semiconductor substrate can be placed, wherein positions of upper surfaces of the support protrusions of the second boat are lower than positions of upper surfaces of corresponding support protrusions of the first boat, the second boat being disposed outside or inside the first boat; and
a pillar lifting device configured to lift the second boat such that the positions of the upper surfaces of the support protrusions provided in the second boat are above the positions of the upper surfaces of the corresponding support protrusions provided in the first boat.

2. The semiconductor manufacturing apparatus according to claim 1,
further comprising a pillar lifting device configured to lift the second boat by at least a first distance;
wherein at a lower portion of at least one of the plurality of pillars provided in the first boat, a recess portion is defined by the at least one pillar having a depth corresponding to the first distance.

3. A semiconductor manufacturing apparatus comprising:
a semiconductor substrate processing chamber;
a gas supply device configured to supply semiconductor substrate processing gas to the semiconductor substrate processing chamber; and
a boat provided in the semiconductor substrate processing chamber including a top support ring and a bottom support ring respectively provided at a top end and a bottom end of the boat, a group of first pillars provided apart from each other between the top support ring and bottom support ring, a second pillar provided apart from the group of first pillars, and a third pillar provided apart from the group of first pillars and the second pillar,
wherein the group of first pillars is provided with a plurality of first support protrusions each having semiconductor substrate placement regions on which a semiconductor substrate can be placed,
the second pillar is provided with a second support protrusion having a semiconductor substrate placement region with an area larger than at least one of the areas of the semiconductor substrate placement regions of the plurality of first support protrusions, wherein the second pillar is configured to move such that a position of an upper surface of the second support protrusion is at a position higher than those of the upper surfaces of the plurality of first support protrusions, and
the third pillar is provided with a third support protrusion having a semiconductor substrate placement region with an area larger than at least one of the areas of the semiconductor substrate placement regions of the plurality of first support protrusions, wherein the third pillar is configured to move such that a position of an upper surface of the third protrusion is at a position higher than those of the upper surfaces of the plurality of first support protrusions.

4. The semiconductor manufacturing apparatus according to claim 3,
wherein the second support protrusion or the third support protrusion is disposed at a position facing one of the plurality of first support protrusions across a plane defined by the semiconductor substrate.

5. A manufacturing method of a semiconductor device, comprising:
providing a semiconductor substrate on a first support protrusion of a semiconductor substrate support boat, the semiconductor substrate support boat being disposed in a processing chamber of a semiconductor manufacturing apparatus;
introducing processing gas into the processing chamber and forming a film on the semiconductor substrate;
moving up a part of the semiconductor substrate support boat at a first processing time since the introduction of processing gas such that the semiconductor substrate is supported by a second support protrusion of the semiconductor substrate support boat;

stopping supply of the processing gas at a second processing time; and removing the semiconductor substrate from the processing chamber.

6. The manufacturing method of claim 5, wherein the first processing time is determined based on the second processing time.

7. A manufacturing method of a semiconductor device, comprising:

providing a semiconductor substrate on a first support protrusion of a semiconductor substrate support boat, the semiconductor substrate support boat being disposed in a processing chamber of a semiconductor manufacturing apparatus;

introducing processing gas into the processing chamber and forming a film on the semiconductor substrate;

moving up a second support protrusion of the semiconductor substrate support boat which faces the first support protrusion at a first processing time since the introduction of processing gas such that the semiconductor substrate is supported by the second support protrusion of the semiconductor substrate support boat and a part of the first support protrusion;

moving up a third support protrusion of the semiconductor substrate support boat which faces the first support protrusion and moving down the second support protrusion at a second processing time since the introduction of processing gas such that the semiconductor substrate is supported by the third support protrusion of the semiconductor substrate support boat and a part of the first support protrusion;

stopping supply of the processing gas at a third processing time since the introduction of processing gas; and removing the semiconductor substrate from the processing chamber.

8. The manufacturing method of claim 7, wherein the first processing time and the second processing time are determined based on the third processing time.

* * * * *